United States Patent
Quinsat et al.

(10) Patent No.: US 10,446,249 B2
(45) Date of Patent: Oct. 15, 2019

(54) MAGNETIC MEMORY DEVICE

(71) Applicant: Toshiba Memory Corporation, Tokyo (JP)

(72) Inventors: Michael Arnaud Quinsat, Kanagawa (JP); Yasuaki Ootera, Kanagawa (JP); Tsuyoshi Kondo, Kanagawa (JP); Nobuyuki Umetsu, Kanagawa (JP); Takuya Shimada, Kanagawa (JP); Masaki Kado, Kanagawa (JP); Susumu Hashimoto, Tokyo (JP); Shiho Nakamura, Kanagawa (JP); Hideaki Aochi, Mie (JP); Tomoya Sanuki, Mie (JP); Shinji Miyano, Kanagawa (JP); Yoshihiro Ueda, Kanagawa (JP); Yuichi Ito, Mie (JP); Yasuhito Yoshimizu, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/120,636

(22) Filed: Sep. 4, 2018

(65) Prior Publication Data
US 2019/0287637 A1  Sep. 19, 2019

(30) Foreign Application Priority Data

Mar. 19, 2018 (JP) .................. 2018-051742

(51) Int. Cl.
*G11C 19/08* (2006.01)
*G11C 11/16* (2006.01)
(Continued)

(52) U.S. Cl.
CPC ........ *G11C 19/0841* (2013.01); *G11C 11/161* (2013.01); *G11C 11/1653* (2013.01);
(Continued)

(58) Field of Classification Search
CPC .............. G11C 19/0841; G11C 11/161; G11C 11/1653; G11C 11/1673; G11C 11/1675; H01L 27/222; H01L 43/02
See application file for complete search history.

(56) References Cited

U.S. PATENT DOCUMENTS 6,538,297 B2   3/2003  Odagawa et al.
6,801,450 B2  10/2004  Perner
(Continued)

FOREIGN PATENT DOCUMENTS

JP    2002-204006 A    7/2002
JP    2003-346472 A   12/2003
(Continued)

OTHER PUBLICATIONS

Kau et al., "A stackable cross point phase change memory," IEDM09, pp. 617-620 (2009).

*Primary Examiner* — Tri M Hoang
(74) *Attorney, Agent, or Firm* — Finnegan, Henderson, Farabow, Garrett & Dunner, L.L.P.

(57) ABSTRACT

According to one embodiment, a magnetic memory device includes a first interconnect, a second interconnect, a first memory portion, and a controller. The first memory portion is provided between the first and second interconnects. The controller is electrically connected with the first and second interconnects. The first memory portion includes a first magnetic member, a first magnetic element, and a first non-linear element. The first magnetic element is provided between the first magnetic member and the second interconnect in a first current path between the first and second interconnects. The first non-linear element is provided between the first magnetic element and the second interconnect in the first current path. The controller is configured to supply a first shift current in the first current path in a first shift operation. The controller is configured to supply a first reading current in the first current path in a first reading operation.

15 Claims, 10 Drawing Sheets

(51) Int. Cl.
*H01L 27/22* (2006.01)
*H01L 43/02* (2006.01)
*H01L 43/10* (2006.01)

(52) U.S. Cl.
CPC ...... *G11C 11/1673* (2013.01); *G11C 11/1675* (2013.01); *H01L 27/222* (2013.01); *H01L 43/02* (2013.01); *H01L 43/10* (2013.01)

(56) References Cited

U.S. PATENT DOCUMENTS

| | | | |
|---|---|---|---|
| 6,834,005 B1 * | 12/2004 | Parkin | G11C 11/14 365/80 |
| 7,110,312 B2 * | 9/2006 | Stephenson | G11C 11/1675 365/209 |
| 8,331,125 B2 | 12/2012 | DeBrosse | |
| 8,467,221 B2 | 6/2013 | Joseph et al. | |
| 8,792,271 B2 | 7/2014 | Morise et al. | |
| 9,153,340 B2 | 10/2015 | Morise et al. | |
| 9,219,225 B2 | 12/2015 | Karda et al. | |
| 9,830,968 B2 | 11/2017 | Shimomura et al. | |
| 2013/0005053 A1 * | 1/2013 | Joseph | G11C 19/0808 438/3 |
| 2014/0119111 A1 | 5/2014 | Nakamura et al. | |
| 2015/0262702 A1 | 9/2015 | Ootera et al. | |
| 2015/0380638 A1 | 12/2015 | Ootera et al. | |
| 2017/0069829 A1 | 3/2017 | Morise et al. | |
| 2017/0117027 A1 * | 4/2017 | Braganca | G11C 11/161 |

FOREIGN PATENT DOCUMENTS

| | | |
|---|---|---|
| JP | 2012-212715 A | 11/2012 |
| JP | 2014-103260 A | 6/2014 |
| JP | 2015-173145 A | 10/2015 |
| JP | 2016-9806 A | 1/2016 |
| JP | 6085396 B2 | 2/2017 |
| JP | 2017-54936 A | 3/2017 |
| JP | 6093146 B2 | 3/2017 |
| JP | 2017-168658 A | 9/2017 |

* cited by examiner

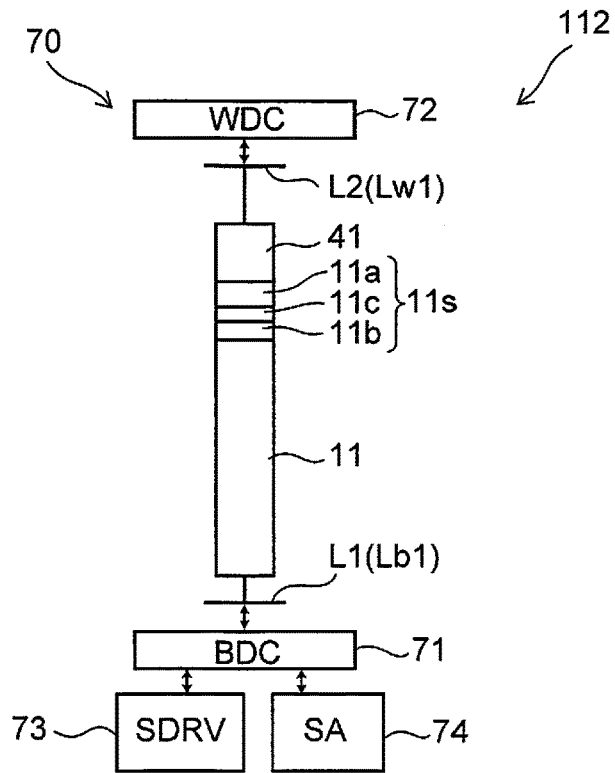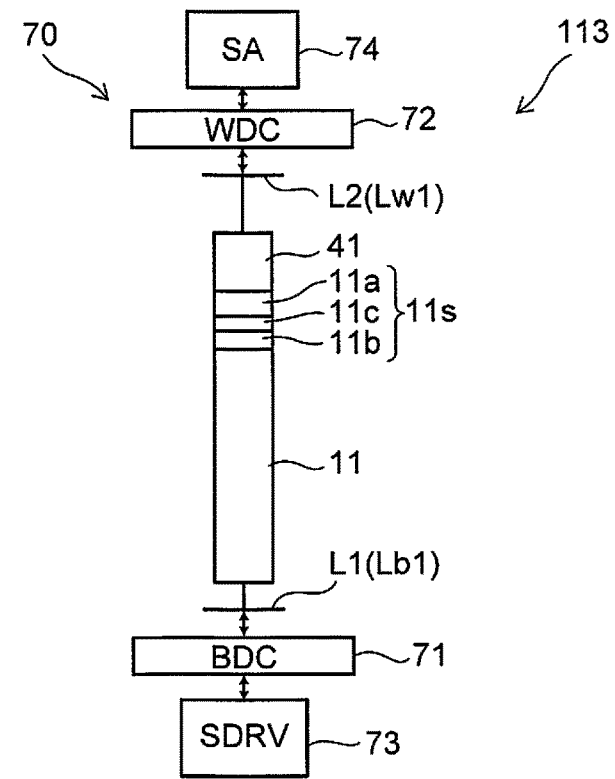

MAGNETIC MEMORY DEVICE

CROSS-REFERENCE TO RELATED APPLICATIONS

This application is based upon and claims the benefit of priority from Japanese Patent Application No. 2018-051742, filed on Mar. 19, 2018; the entire contents of which are incorporated herein by reference.

FIELD

Embodiments described herein relate generally to a magnetic memory device.

BACKGROUND

There is a magnetic memory device including a magnetic shift register based on a magnetic material. A stable operation is desired in the magnetic memory device.

BRIEF DESCRIPTION OF THE DRAWINGS

FIG. 5 is a schematic view illustrating a magnetic memory device according to the first embodiment;

FIG. 6 is a schematic view illustrating a magnetic memory device according to the first embodiment;

DETAILED DESCRIPTION

Figure 1:
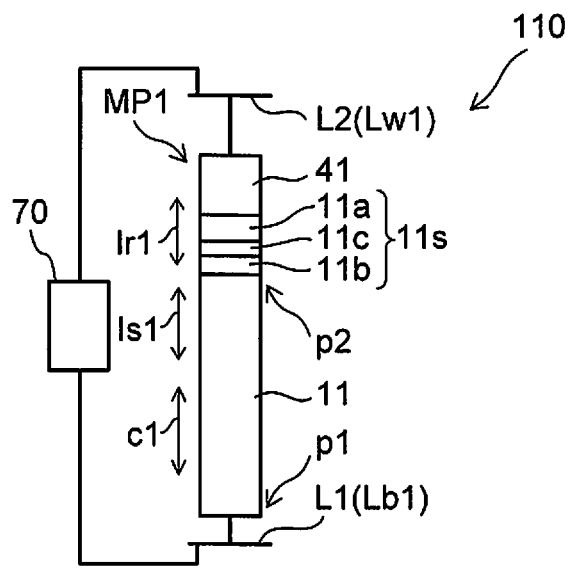
FIG. 1 is a schematic view illustrating the magnetic memory device according to a first embodiment.

According to one embodiment, a magnetic memory device includes a first interconnect, a second interconnect, a first memory portion, and a controller. The first memory portion is provided between the first interconnect and the second interconnect. The controller is electrically connected with the first interconnect and the second interconnect. The first memory portion includes a first magnetic member, a first magnetic element, and a first non-linear element. The first magnetic element is provided between the first magnetic member and the second interconnect in a first current path between the first interconnect and the second interconnect. The first non-linear element is provided between the first magnetic element and the second interconnect in the first current path. The controller is configured to supply a first shift current in the first current path in a first shift operation. The controller is configured to supply a first reading current in the first current path in a first reading operation.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic view illustrating a magnetic memory device according to a first embodiment.

As shown in FIG. 1, the magnetic memory device 110 according to the embodiment includes a first interconnect L1, a second interconnect L2, a first memory portion MP1, and a controller 70.

The first memory portion MP1 is provided between the first interconnect L1 and the second interconnect L2. The first interconnect L1 is one of a plurality of bit lines (for example, first bit line Lb1), for example. The second interconnect L2 is one of a plurality of the word lines (for example, first word line Lw1).

The first memory portion MP1 includes a first magnetic member 11, a first magnetic element 11$s$, and a first non-linear element 41.

In this example, the first magnetic member 11 includes a first magnetic portion p1 and a second magnetic portion p2. For example, the first magnetic member 11 extends along a direction from the first magnetic portion p1 toward the second magnetic portion p2. The first magnetic portion p1 is one end of the first magnetic member 11. The second magnetic portions p2 is another end of the first magnetic member 11. The first magnetic element 11$s$ is provided between the first magnetic member 11 and the second interconnect L2 in a first current path c1. The first current path c1 is between the first interconnect L1 and the second interconnect L2.

In this example, the first magnetic element 11$s$ includes the first magnetic layer 11$a$ and the first non-magnetic layer 11$c$. The first non-magnetic layer 11$c$ is provided between at least a part of the first magnetic member 11 and the first magnetic layer 11$a$. The at least the part of the first magnetic member 11 is a part of the second magnetic portion p2, for example. For example, a magnetoresistive element is formed of the first magnetic layer 11$a$, the first non-magnetic layer 11$c$, and the second magnetic portion p2. The magnetoresistive element is a MTJ (Magnetic Tunnel Junction) element, for example. The first magnetic element 11s is MT) element, for example.

In this example, the first magnetic element 11s further includes a first intermediate magnetic layer 11b. The first intermediate magnetic layer 11b is provided between the part of the above-mentioned first magnetic member 11 and the first non-magnetic layer 11c. In this case, the magnetoresistive element is formed of the first magnetic layer 11a, the first non-magnetic layer 11c, and the first intermediate magnetic layer 11b. For example, the part of the above-mentioned first magnetic member 11 is magnetically coupled with the first intermediate magnetic layer 11b.

The first non-linear element 41 is provided in the first current path c1 between first magnetic elements 11s and the second interconnect L2. The electrical resistance of the first non-linear element 41 changes with a voltage applied to the first non-linear element 41, for example. For example, the electrical resistance in a first voltage range differs from the electrical resistance in a second voltage range. The first non-linear element 41 functions as a switch, for example.

In one example, the first non-linear element 41 includes at least one selected from the group consisting of Te, Se, and Ge.

The orientation of magnetization of the first magnetic member 11 can change with external energies applied to the first magnetic member 11. The orientation of magnetization corresponds to the information being memorized. For example, the orientation of magnetization is reversed by a writing operation described later.

In the magnetic memory device 110, a reading operation of information and a shift operation of information are performed. In the shift operation, the magnetization in the first magnetic member 11 shifts inside of the first magnetic member 11. The writing operation, the reading operation, and the shift operation are performed by the controller 70, for example.

As mentioned later, in the magnetic memory device, a plurality of memory portions (a first memory portion MP1 etc.) may be provided. Below, the reading operation relating to the first memory portion MP1 is to be "a first reading operation". The shift operation relating to the first memory portion MP1 is to be "a first shift operation". The writing operation relating to the first memory portion MP1 is to be "a first writing operation".

In the embodiment, the controller 70 supplies a first shift current Is1 to the first current path c1 in the first shift operation. The controller 70 supplies a first reading current Ir1 to the first current path c1 in the first reading operation.

For example, the value of the first shift current Is1 is larger than the value of first reading current Ir1. The magnetization shifts by the first shift current Is1. When the first reading current Ir1 flows, the magnetization is not shifted substantially. For example, the shift operation and the reading operation are distinguished by the difference of the value of the currents.

The first non-linear element 41 is provided in the embodiment. Even in a case where a plurality of memory portions are provided, the memory portion to be object can be selected by the first non-linear element 41. Thereby, even if the first shift current Is1 and the first reading current Ir1 flow into the same current path (the first current path c1), the operation of the memory portion to be object is obtained.

According to the embodiment, the magnetic memory device in which a stable operation is possible can be provided. In the embodiment, the structure is simple. High memory density is obtained.

Hereinafter, an example of the magnetic memory device 110 is further described.

Figure 2:
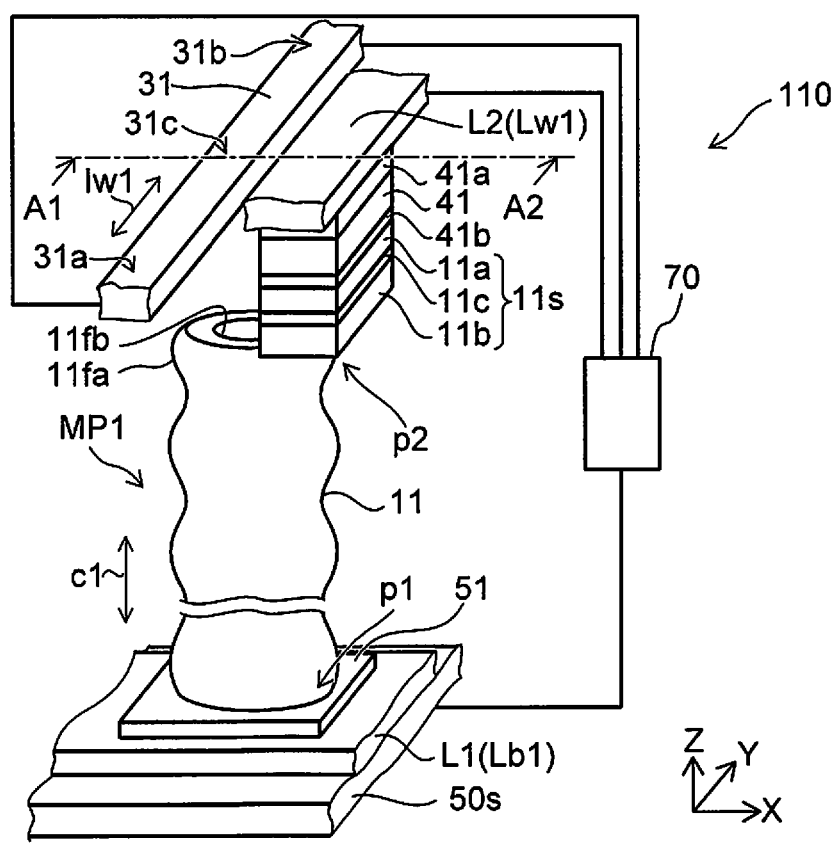
FIG. 2 is a schematic perspective view illustrating the magnetic memory device according to the first embodiment.

FIG. 2 is a schematic perspective view illustrating the magnetic memory device according to the first embodiment.

Figure 3:
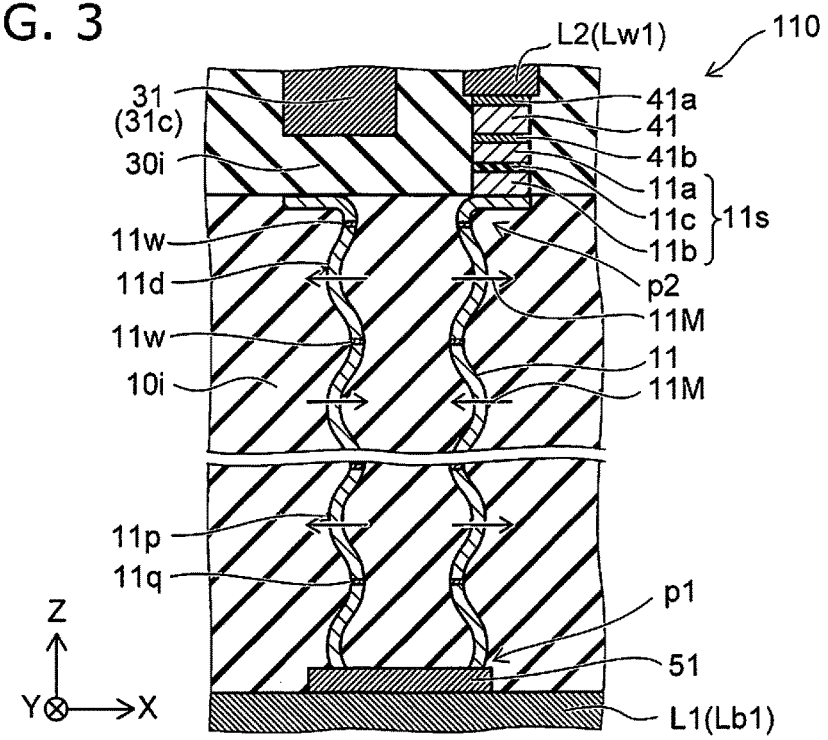
FIG. 3 is a schematic cross-sectional view illustrating the magnetic memory device according to the first embodiment.
Figure 4:
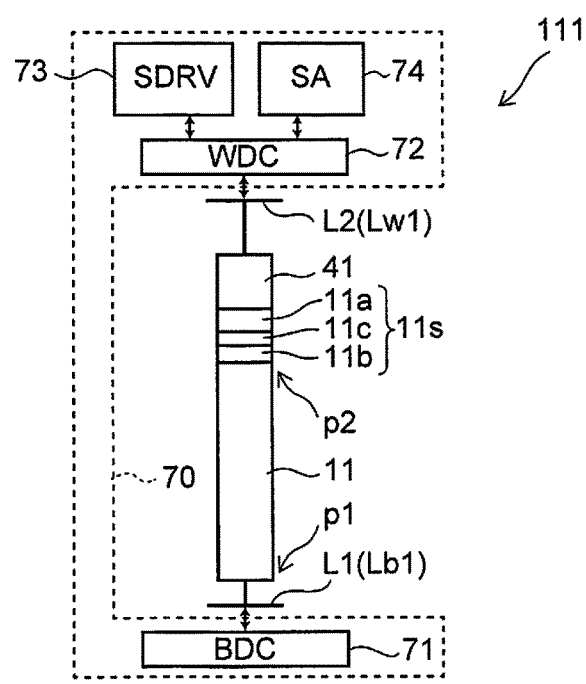
FIG. 4 is a schematic view illustrating a magnetic memory device according to the first embodiment.
Figure 7:
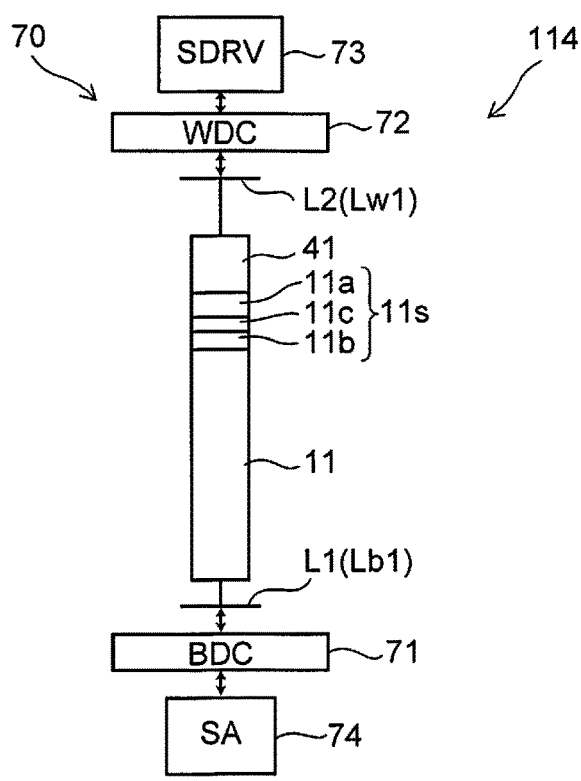
FIG. 7 is a schematic view illustrating a magnetic memory device according to the first embodiment.

FIG. 3 is a schematic cross-sectional view illustrating the magnetic memory device according to the first embodiment.

FIG. 3 is a cross-sectional view of A1-A2 line in FIG. 2. In FIG. 2, a part of an insulating portion is omitted for easy to understand.

As shown in FIG. 2, the first magnetic member 11 extends along the first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first interconnect L1 extends along the second direction. The second direction crosses the first direction. In this example, the second direction is the X-axis direction. The second interconnect L2 extends along the third direction. The third direction crosses a plane including the first direction and the second direction. In this example, the third direction is the Y-axis direction.

In this example, the first magnetic member 11 has a pipe configuration which extends in the Z-axis direction. In this example, the first magnetic member 11 has "constriction" structure. For example, the first magnetic member 11 includes a first face 11fa and a second face 11fb. The first face 11fa is an outside of the pipe. The second face 11fb is an inner side of the pipe. For example, the position in a fourth direction of the first face 11fa changes periodically along the Z-axis direction. For example, the position in the fourth direction of the second face 11fb changes periodically along the Z-axis direction. The fourth direction is an arbitrary direction which crosses the Z-axis direction.

In this example, the first interconnect L1 is provided on a base 50s. A first electrode 51 is provided between the first interconnect L1 and the first magnetic member 11. The first memory portion MP1 is provided on the first electrode 51. On a part of the second magnetic portion p2 of the first magnetic member 11, the first magnetic element 11s is provided. The first non-linear element 41 is provided between first magnetic elements 11s and the second interconnect L2. In this example, an electrode 41a is provided between the second interconnect L2 and the first non-linear element 41. An electrode 41b is provided between first magnetic elements 11s and the first non-linear element 41.

As shown in FIG. 3, the first magnetic member 11 is provided with a plurality of convex portions 11p and a plurality of concave portions 11q. The plurality of convex portions 11p and the plurality of concave portions 11q are arranged alternately along the Z-axis direction. The width of the convex portion 11p is wider than the width of the concave portion 11q. The widths are the length in a direction which crosses the Z-axis direction.

For example, the first magnetization 11M of the first magnetic member 11 has a first state and a second state. In the first state, the first magnetization 11M orients to outside from the inner side. In the second state, the first magnetization 11M orients to the inner side from the outside. A plurality of orientations in the magnetization correspond to the information memorized. In the first magnetic member 11, a plurality of first magnetic walls 11w are provided. The region between the plurality of first magnetic walls 11w corresponds to first magnetic domains 11d. For example, the first magnetization 11M of the first magnetic domains 11d is controlled. Information is memorized in the first magnetic domains 11d. For example, the first magnetic wall 11w is formed in the concave portion 11q. The controllability of the position of the first magnetic wall 11w becomes high.

In this example, the first magnetization 11M of the first magnetic member 11 is controlled by a first conductive layer 31 described below. The control of the first magnetization 11M corresponds to the writing operation. In the embodiment, various methods are applicable to the writing operation. Below, the writing operation using the first conductive layer 31 is described.

As shown in FIG. 2, the first conductive layer 31 is electrically connected with the controller 70. The first conductive layer 31 is apart from the first magnetic member 11. For example, a part of the first conductive layer 31 overlaps the first magnetic member 11. In this example, a part of the first conductive layer 31 overlaps a part of the first magnetic member 11 in the Z-axis direction.

For example, the first conductive layer 31 includes a first conductive portion 31a, a second conductive portion 31b, and a third conductive portion 31c. The third conductive portion 31c is between the first conductive portion 31a and the second conductive portion 31b. A direction from the at least the part of the first magnetic member 11 toward at least a part of the third conductive portion 31c is along the first direction (the Z-axis direction).

As shown in FIG. 2 and FIG. 3, a first direction from the third conductive portion 31c toward the magnetic elements 11s crosses the first direction (Z-axis direction).

As shown in FIG. 3, an insulating member 30i is provided. The insulating member 30i is provided between the at least the part of the first magnetic member 11 and the third conductive portion 31c. The insulating member 30i is provided around the first conductive layer 31, the first magnetic elements 11s, and the first non-linear element 41.

For example, the controller 70 supplies a first writing current Iw1 (see FIG. 2) to the first conductive layer 31 in the first writing operation. For example, the orientation of the magnetization (the first magnetization 11M) of a part of the first magnetic member 11 changes with an effect from the first conductive layer 31. Thereby, the writing operation is performed.

For example, the first writing current Iw1 may flow in an orientation from the first conductive portion 31a toward the second conductive portion 31b. Alternatively, the first writing current Iw1 may flows in an orientation from the second conductive portion 31b to the first conductive portion 31a. For example, the information to be written changes with the orientation of the current.

For example, first information is information to be written when the first writing current Iw1 flows through the first conductive layer 31 in a first orientation. Second information is information to be written when the first writing current Iw1 flows through the first conductive layer 31 in a second orientation. The second orientation is inverse to the first orientation. The first information differs from the second information.

The first information is one of "0" and "the 1." The second information is another one of "0" and "1."

FIG. 4-FIG. 7 are schematic views illustrating the magnetic memory devices according to the first embodiment.

As shown in FIG. 4-FIG. 7, in the magnetic memory devices 111-114 according to the embodiment, a first decoder 71 and a second decoder 72 are provided. The first decoder 71 is electrically connected with the first interconnect L1. The second decoder 72 is electrically connected with the second interconnect L2. The first decoder 71 is a bit line decoder BDC, for example. The second decoder 72 is a word line decoder WDC, for example. The first decoder 71 and the second decoder 72 are included in the controller 70.

In the magnetic memory devices 111-114, a shift driver 73 (SDRV) and a sense amplifier 74 (SA) are provided. The shift driver 73 and the sense amplifier 74 are included in the controller 70.

In the magnetic memory device 111, the shift driver 73 is connected with the second decoder 72. The sense amplifier 74 is connected with the second decoder 72.

In the magnetic memory device 112, the shift driver 73 is connected with the first decoder 71. The sense amplifier 74 is connected first decoder 71.

In the magnetic memory device 113, the shift driver 73 is connected with the first decoder 71. The sense amplifier 74 is connected with the second decoder 72.

In the magnetic memory device 114, the shift driver 73 is connected with the second decoder 72. The sense amplifier 74 is connected with the first decoder 71.

Second Embodiment

Figure 8:
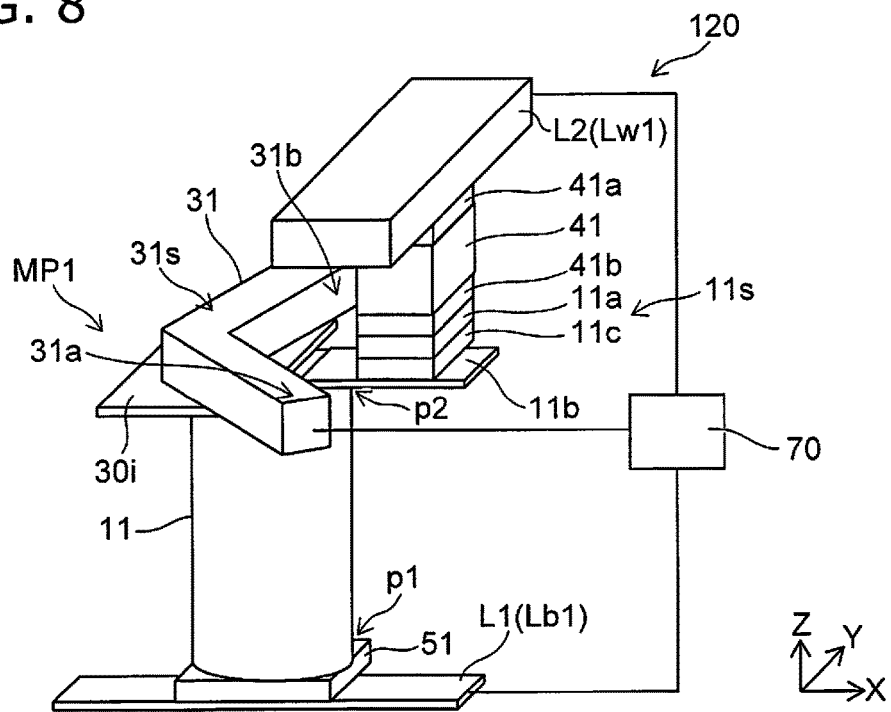
FIG. 8 is a schematic perspective view illustrating a magnetic memory device according to a second embodiment.

FIG. 8 is a schematic perspective view illustrating the magnetic memory device according to a second embodiment.

As shown in FIG. 8, in the magnetic memory device 120 according to the embodiment, at least a part of the first conductive layer 31 curves. The configuration of the magnetic memory device 120 other than this is the same as the configuration of the magnetic memory device 110.

In this example, a direction from the third conductive portion 31c toward the first magnetic element 11s is along the X-axis direction. For example, a position along the X-axis direction of the first conductive portion 31a is between a position along the X-axis direction of the third conductive portion 31c and a position along the X-axis direction of the first magnetic elements 11s. For example, a position along the X-axis direction of the second conductive portion 31b is between a position along the X-axis direction of the third conductive portion 31c and a position along the X-axis direction of the first magnetic elements 11s.

For example, the effect to the first magnetic member 11 from the third conductive portion 31c becomes large. An efficient writing can be performed.

Third Embodiment

In the embodiment, a plurality of memory portions are provided. For example, a second memory portion is provided in addition to the first memory portion MP1 already described. Below, the second memory portion MP2 is described.

Figure 9:
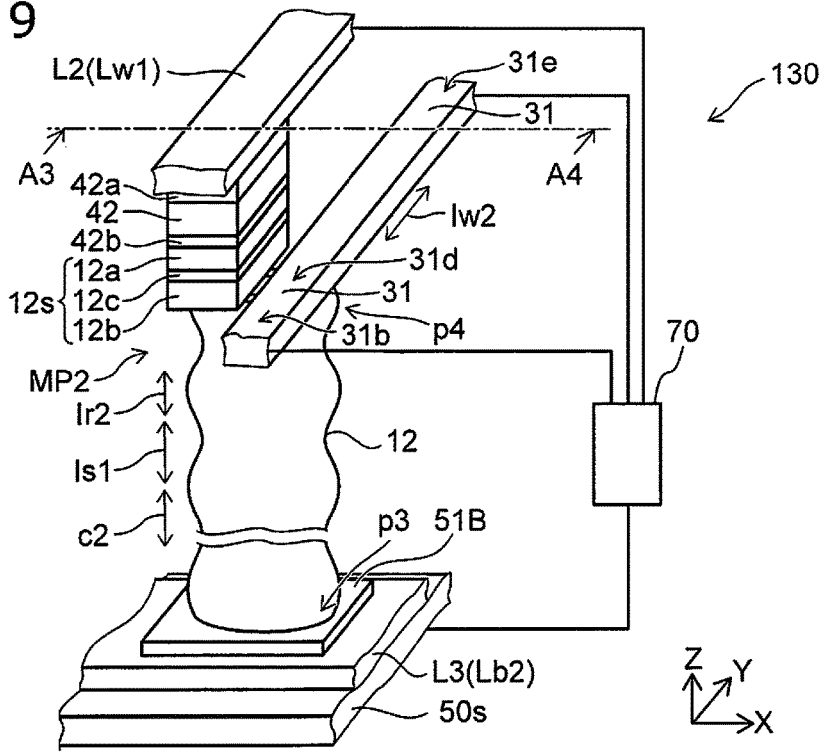
FIG. 9 is a schematic perspective view illustrating a magnetic memory device according to a third embodiment.

FIG. 9 is a schematic perspective view illustrating a magnetic memory device according to a third embodiment.

Figure 10:
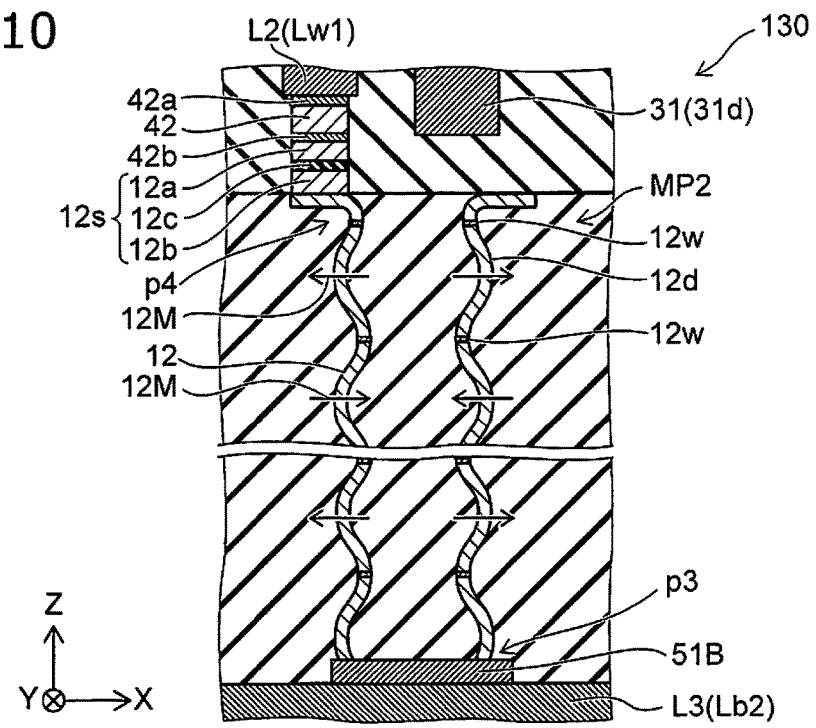
FIG. 10 is a schematic cross-sectional view illustrating the magnetic memory device according to the third embodiment.

FIG. 10 is a schematic cross-sectional view illustrating the magnetic memory device according to the third embodiment.

FIG. 10 is a cross-sectional view of A3-A4 line of FIG. 9. In FIG. 9, a part of the insulating portion is omitted for easy to understand.

As shown in FIG. 9 and FIG. 10, in the magnetic memory device 130, a second memory portion MP2 and a third interconnect L3 are provided. The third interconnect L3 corresponds to a second bit line Lb2, for example. The controller 70 is connected with the third interconnect L3.

The second memory portion MP2 is provided between the third interconnect L3 and the second interconnect L2.

The second memory portion MP2 includes a second magnetic member 12, a second magnetic element 12s, and a second non-linear element 42. The second magnetic element 12s is provided between the second magnetic member 12 and the second interconnect L2 in a second current path c2. The second current path c2 is between the third interconnect L3 and the second interconnect L2. The second magnetic element 12s is provided between the second magnetic member 12 and the second interconnect L2 in the second current path c2. For example, the second magnetic member 12 includes a third magnetic portion p3 and a fourth magnetic portion p4. The third magnetic portion p3 is electrically connected with the third interconnect L3. Between the fourth magnetic portion p4 and the second non-linear element 42, the second magnetic element 12s is provided.

For example, the third interconnect L3 is provided on the base 50s. An electrode 51B is provided on the third interconnect L3. The second memory portion MP2 is provided on the electrode 51B.

The controller 70 performs a second shift operation, a second reading operation, and a second writing operation, for example. These operations are operations relating to the second memory portion MP2.

The controller 70 supplies a second shift current Is2 to the second current path c2 in the second shift operation. The controller 70 supplies a second reading current Ir1 to the second current path c2 in the second reading operation.

The controller 70 supplies a second writing current Iw2 to the first conductive layer 31, for example in the second writing operation. The second writing current Iw2 may be the same as the first writing current Iw1.

As shown in FIG. 9, the first conductive layer 31 further includes a fourth conductive portion 31d, and a fifth conductive portion 31e. For example, the second conductive portion 31b is provided between the first conductive portion 31a and the fifth conductive portion 31e (see FIG. 2 and FIG. 9). The fourth conductive portion 31d is provided between the second conductive portion 31b and the fifth conductive portion 31e (see FIG. 9). The second magnetic member 12 extends along the first direction (Z-axis direction). In this example, a direction from at least a part of the second magnetic member 12 toward the fourth conductive portion 31d is along the first direction.

As shown in FIG. 9 and FIG. 10, a direction from the fourth conductive portions 31d toward the second magnetic element 12s crosses the first direction.

Also in the second magnetic member 12, a plurality of second magnetic walls 12w are provided. The region between the plurality of second magnetic walls 12w corresponds to a second magnetic domain 12d.

The second magnetic element 12s includes a second magnetic layer 12a and a second non-magnetic layer 12c. In this example, a second intermediate magnetic layer 12b is provided. An electrode 42b is provided between the second magnetic layer 12a and the second non-linear element 42. An electrode 42a is provided between the second non-linear element 42 and the second interconnect L2.

Figure 11:
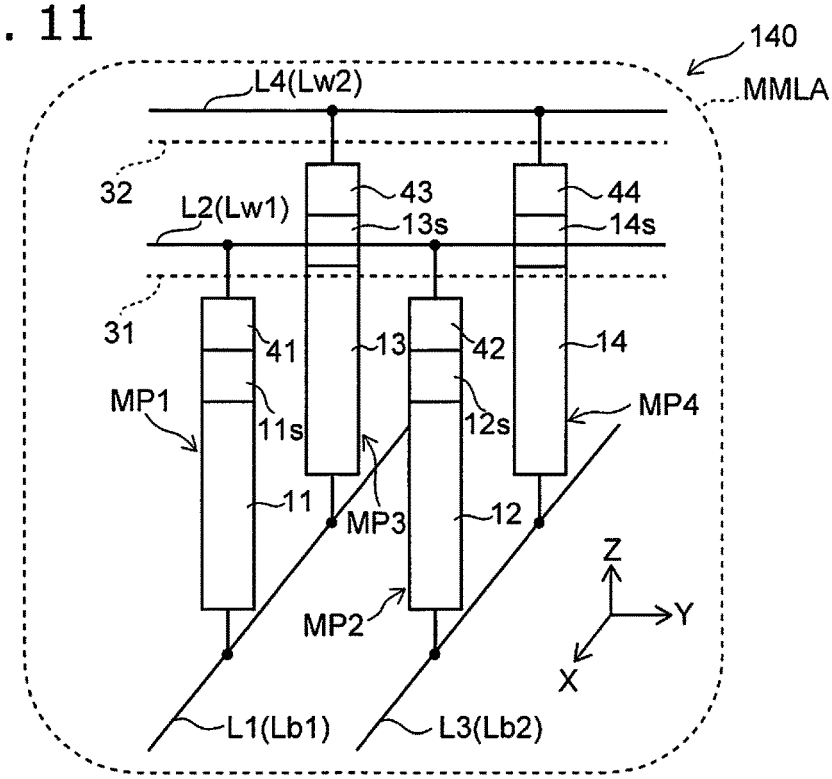
FIG. 11 is a schematic view illustrating a magnetic memory device according to the third embodiment.

FIG. 11 is a schematic view illustrating the magnetic memory device according to a third embodiment.

Figure 12:
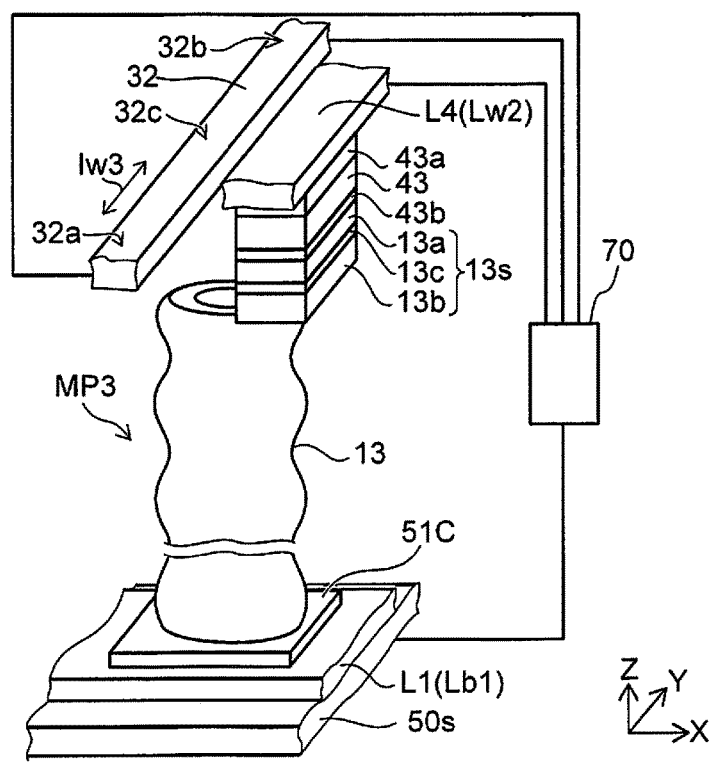
FIG. 12 is a schematic perspective view illustrating a part of the magnetic memory device according to the third embodiment.
Figure 13:
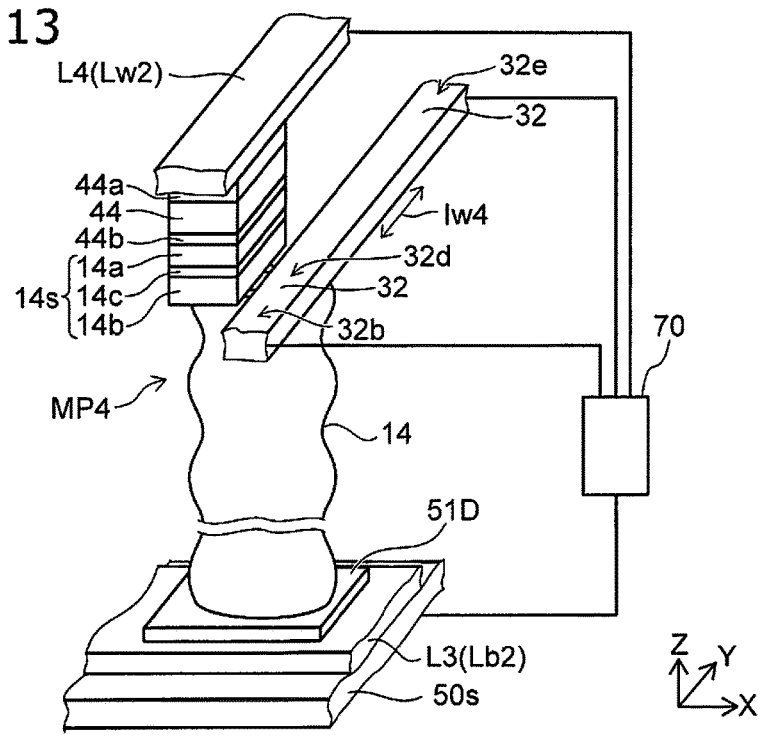
FIG. 13 is a schematic perspective view illustrating a part of the magnetic memory device according to the third embodiment.

FIG. 12 and FIG. 13 are schematic perspective views illustrating a portion of the magnetic memory device according to the third embodiment.

In FIG. 12 and FIG. 13, a part of the insulating portion is omitted for easy to understand.

As shown in FIG. 11, a plurality of memory portions are provided also in the magnetic memory device 140 according to the embodiment. In this example, the first to fourth memory portions MP1-MP4 are illustrated.

A plurality of word lines (for example, the first word line Lw1 and a second word line Lw2) are provided. A plurality of bit lines (for example, the first bit line Lb1 and the second bit line Lb2) are provided. A plurality of conductive layers (in this example, the first conductive layer 31 and a second conductive layer 32) are provided.

The first to fourth interconnects L1-L4 are provided. The first interconnect L1 corresponds to the first bit line Lb1. The second interconnect L2 corresponds to the first word line Lw1. The third interconnect L3 corresponds to the second bit line Lb2. The fourth interconnect L4 corresponds to the second word line Lw2.

The third memory portion MP3 is provided between the first interconnect L1 and the fourth interconnect L4. The third memory portion MP3 includes a third magnetic member 13, a third magnetic element 13s, and a third non-linear element 43.

The fourth memory portion MP4 is provided between the second interconnect L2 and the fourth interconnect L4. The fourth memory portion MP4 includes the fourth magnetic member 14, the fourth magnetic element 14s, and the fourth non-linear element 44.

As shown in FIG. 12, third magnetic element 13s includes a third magnetic layer 13a and a third non-magnetic layer 13c, for example. In this example, a third intermediate magnetic layer 13b is provided. For example, an electrode 43a is provided between the third nonlinear element 43 and the fourth interconnect L4. For example, an electrode 43b is provided between the third nonlinear element 43 and the third magnetic element 13s. An electrode 51C is provided between the first interconnect L1 and the third memory portion MP3. The second conductive layer 32 includes a region 32a, a region 32b, and a region 32c. A direction from at least a part of the third magnetic member 13 toward the region 32c is along the Z-axis direction. A third writing current Iw3 flows in the second conductive layer 32.

As shown in FIG. 13, the fourth magnetic element 14s includes a fourth magnetic layer 14a and a fourth non-magnetic layer 14c, for example. In this example, a fourth intermediate magnetic layer 14b is provided. For example, an electrode 44a is provided between the fourth nonlinear element 44 and the fourth interconnect L4. For example, an electrode 44b is provided between the fourth nonlinear element 44 and the fourth magnetic element 14s. An electrode 51D is provided between the third interconnect L3 and the fourth memory portion MP4. The second conductive layer 32 further includes a region 32d and a region 32e. A direction from at least a part of the fourth magnetic member 14 toward the region 32d is along the Z-axis direction from. A fourth writing current Iw4 flows in the second conductive layer 32. The fourth writing current Iw4 may be the same as the third writing current Iw3.

The controller 70 performs the shift operation, the reading operation, and the writing operation for the plurality of memory portions by controlling the potential of these interconnects and the conductive layers.

In the embodiment, in the first shift operation, the controller 70 sets the first interconnect L1 at a first potential V1, and sets the second interconnect L2 at a second potential V2. In the first reading operation, the controller 70 sets the first interconnect L1 at a third potential V3, and sets the second interconnect L2 at a fourth potential V4. In one example, the fourth potential V4 is between the first potential V1 and the second potential V2. The fourth potential V4 is between the third potential V3 and the second potential V2.

In one example, the third potential V3 is between the first potential V1 and the second potential, and the third potential V3 may be between the first potential V1 and the fourth potential V4.

For example, a selected bit line is set to BLi. A selected word line is set to WLj. In one example, the selected bit line (BLi) and the selected word line (WLj), satisfy the following relation, for example.

$$V_{BL}^{shift} = V_{BL}^{Read} < 0V < V_{WL}^{Read} < V_{WL}^{shift}.$$

For example, a selected bit line is set to BLi. A selected word line is set to WLj. In one example, the selected bit line (BLi) and the selected word line (WLj), satisfy the following relation, for example.

$$V_{BL}^{shift} < V_n^{Read} < 0V < V_{WL}^{Read} <= V_m^{shift}.$$

A non-selected bit line is set to BL $\{k\}$. A non-selected word line is set to WL $\{l\}$. k differs from i. l differs from j. In the non-selected bit line (BL $\{k\}$) and the non-selected word line (WL $\{l\}$) the following relation, for example.

$$V{BL_{\{k\}}}^{shift} = V_{BL}\{k\}^{Read} = V_{WL}\{l\}^{Read} = V_{WL}\{l\}^{shift} = 0V.$$

The first to the fourth memory portions MP1-MP4, etc. are included in a memory array MMLA, for example.

Figure 14:
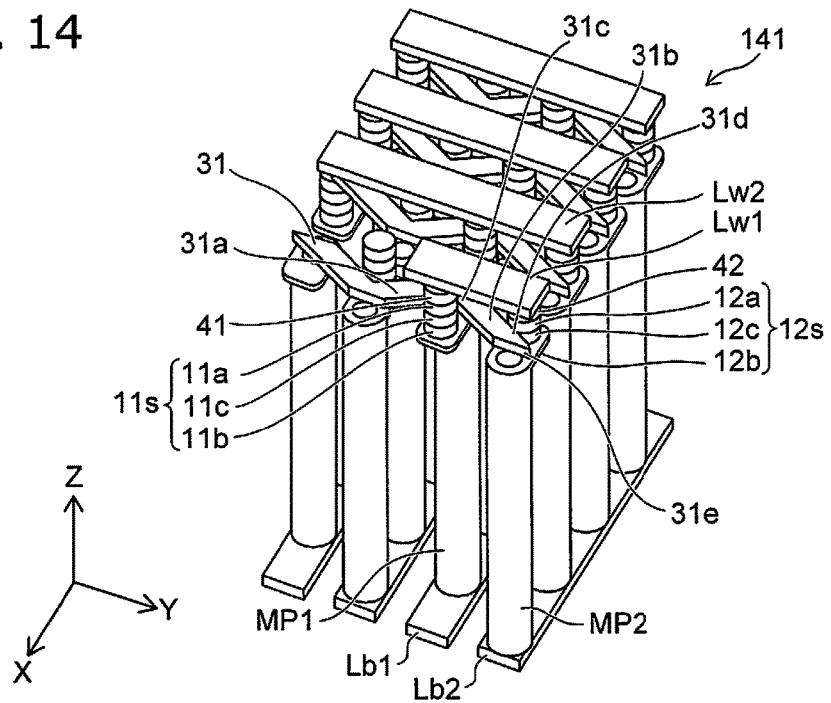
FIG. 14 is a schematic perspective view illustrating a magnetic memory device according to the third embodiment.
Figure 15:
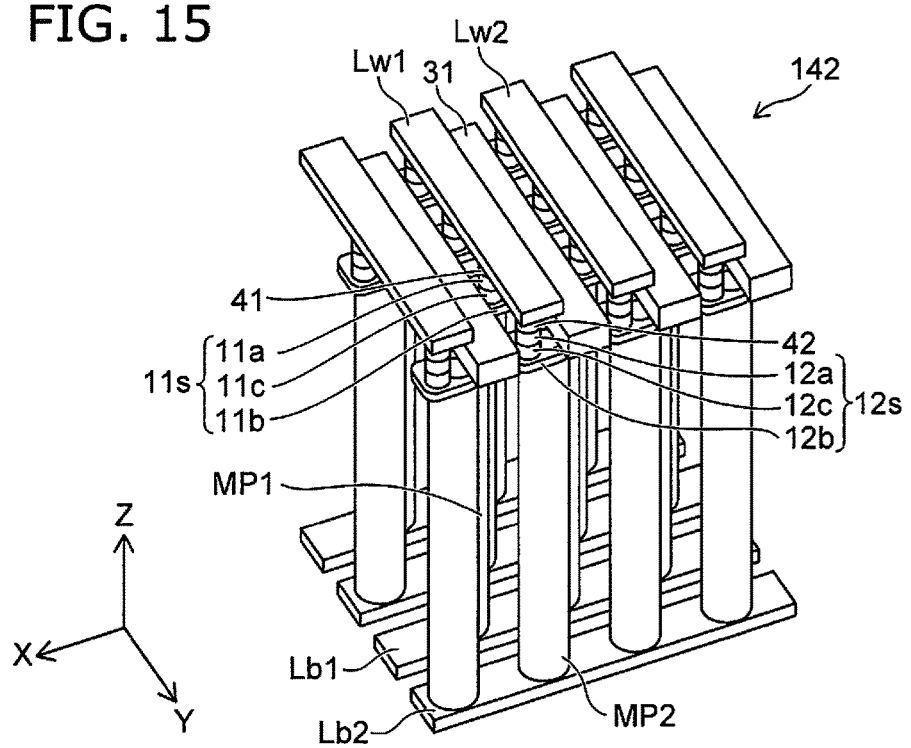
FIG. 15 is a schematic perspective view illustrating a magnetic memory device according to the third embodiment.

FIG. 14 and FIG. 15 are schematic perspective views illustrating magnetic memory devices according to the third embodiment.

As shown in FIG. 14, in the magnetic memory device 141, the first conductive layer 31 extends in a shape of ZIG ZAG. For example, a direction from the first magnetic elements 11s toward the second magnetic element 12s crosses a direction from the third conductive portion 31c toward the fourth conductive portion 31d. The effect from the first conductive layer 31 is effectively applied to the first magnetic member 11 and the second magnetic member 12. A further stable operation is obtained.

As shown in FIG. 15, in the magnetic memory device 142, the first conductive layer 31 extends in a straight line shape.

Figure 16:
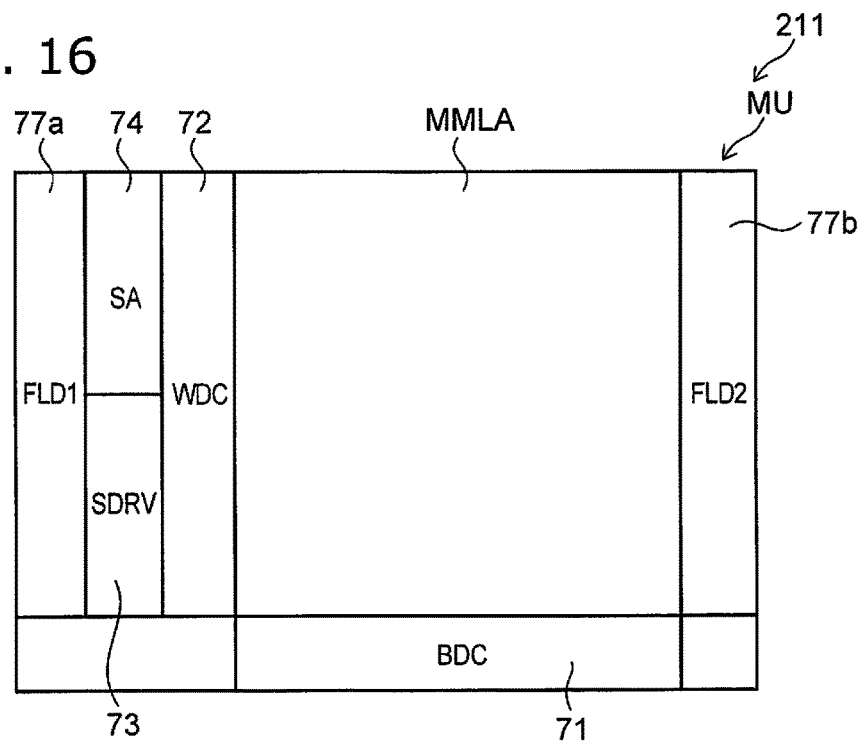
FIG. 16 is a schematic view illustrating a magnetic memory device according to the third embodiment.

FIG. 16 is a schematic view illustrating a magnetic memory device according to the third embodiment.

As shown in FIG. 16, in the magnetic memory device 211 according to the embodiment, a drive circuit is provided around the memory array MMLA. The drive circuit includes the word line decoder WDC, the bit line decoder BDC, the shift driver SDRV, and the sense amplifier SA, for example. In this example, the first circuit 77a (drive circuit FLD1) and the second circuit 77a (drive circuit FLD2) are provided. The memory array MMLA and the drive circuit are included in a memory unit MU.

Figure 17:
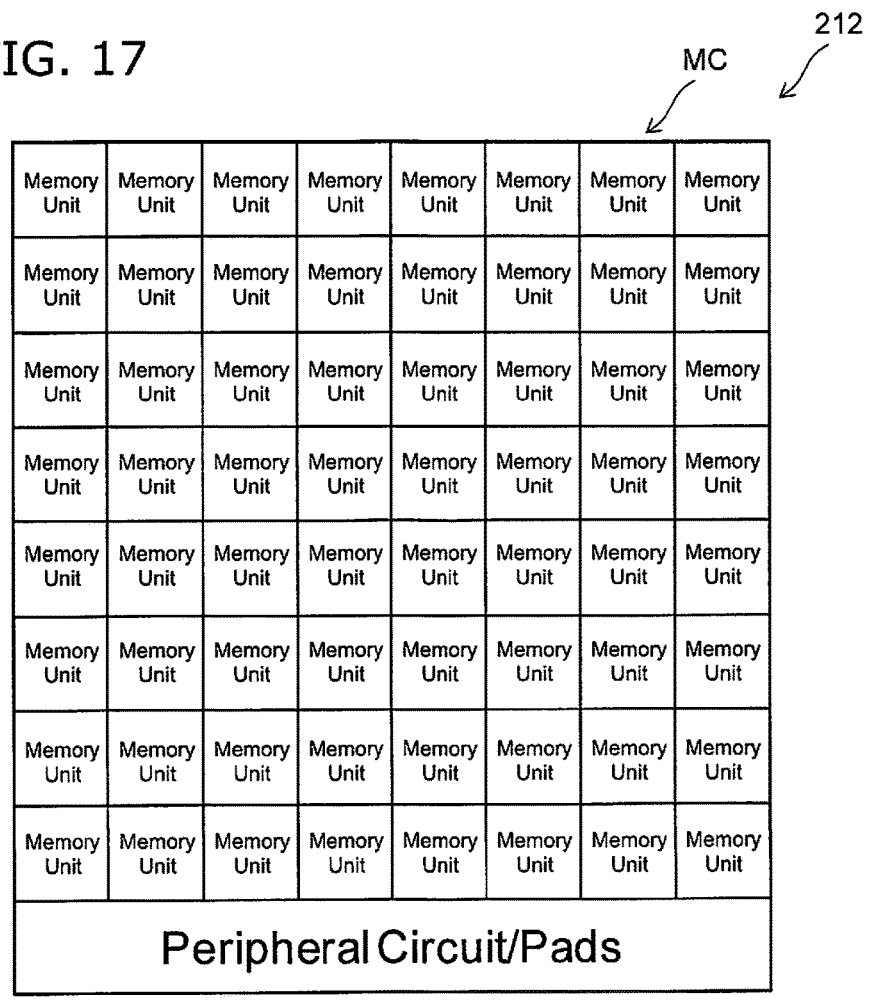
FIG. 17 is a schematic view illustrating a magnetic memory device according to the third embodiment.

FIG. 17 is a schematic view illustrating a magnetic memory device according to the third embodiment.

As shown in FIG. 17, in the magnetic memory device 212 according to the embodiment, a plurality of memory units MU, a peripheral circuit, and a pad are provided. The plurality of memory units MU, the peripheral circuit, and the pad are provided in a memory chip MC.

Figure 18:
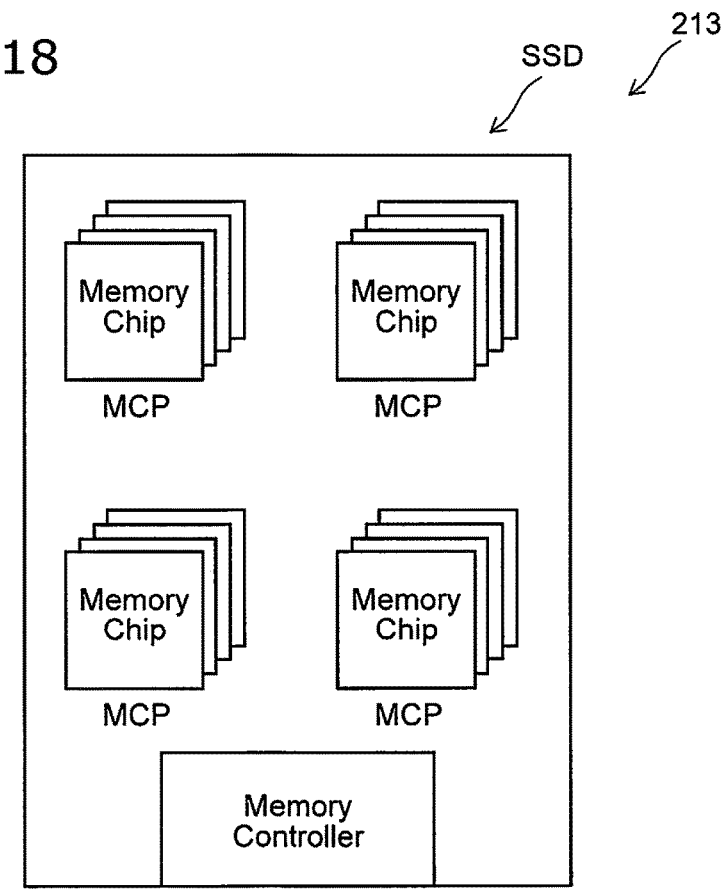
FIG. 18 is a schematic view illustrating a magnetic memory device according to the third embodiment.

FIG. 18 is a schematic view illustrating a magnetic memory device according to the second embodiment.

As shown in FIG. 18, in the magnetic memory device 213 according to the embodiment, a plurality of memory chips MC are provided. The plurality of memory chips MC are included in a memory chip package MCP. In this example, a plurality of memory chip packages MCP and a memory controller are provided. The plurality of memory chip packages MCP and the memory controller are included in SSD (Solid State Drive).

Hereinafter, examples of the material in the embodiment are described.

The first magnetic member 11 includes a perpendicular magnetization film, for example.

The first magnetic member 11 may include a rare earth-transition metal amorphous alloy, for example. The rare earth-transition metal amorphous alloy includes an alloy including a rare earth transition metal and a 3d transition metal, for example. The rare earth-transition metal amorphous alloy is a ferrimagnetic material, for example. The rare earth-transition metal amorphous alloy includes at least one selected from the group consisting of Tb (Terbium), Dy (dysprosium), and Gd (gadolinium), for example, and at least one of the transition metals. The rare earth-transition metal amorphous alloy includes at least one selected from the group consisting of TbFe, TbCo, TbFeCo, DyTbFeCo, GdTbCo, and GdFeCo, for example.

The first magnetic member 11 may also include a multi-layer film, for example. The first magnetic member 11 includes at least one selected from the group consisting of a multilayer film including a Co film and a Ni film, a multilayer film including a Co film and a Pd film, and a multilayer film including a Co film and a Pt film, for example.

The first magnetic member 11 may also include an ordered alloy, for example. The ordered alloy includes at least one selected from the group consisting of Fe, Co, and Ni, for example, and at least one selected from the group consisting of Pt and Pd. The crystal structure in the ordered alloy is $L_{10}$ type, for example. The ordered alloy may also include at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$, for example. The composition ratio in the ordered alloy is not limited to the above.

The first magnetic member 11 may also include the ordered alloy and other elements. The other elements include at least one selected from the group consisting of V, Mn, Cu, Cr, B, and Ag, for example. Magnetic anisotropy energy or saturation magnetization may be adjusted by addition of these elements, for example. For example, large anisotropy energy is obtained.

The first magnetic member 11 includes at least one selected from the group consisting of Fe, Co, and Ni, for example. The first magnetic member 11 may include an alloy including at least one selected from the group consisting of Fe, Co, and Ni, for example. The first magnetic member 11 may further include other elements (for example, semimetal), for example. The other elements include at least one selected from the group consisting of boron and silicon, for example. The first magnetic member 11 may include a multilayer film, for example. The multilayer film includes a first film and a second film. The first film includes at least one selected from the group consisting of Fe, Co, and Ni, for example. The second film includes a platinum group (for example, Pt, Pd, etc.). The first magnetic member 11 includes a multilayer film (Co-Fe/Ni multilayer film) including the Ni film and a film of a Co—Fe alloy, for example.

The first electrode 51 includes at least one selected from the group consisting of Cu, Ag, Au, and Al, for example. The first electrode 51 may include an alloy including at least one of these elements.

The first non-magnetic layer 11c, for example, includes at least one selected from the group consisting of an aluminum oxide ($AlO_x$), an aluminum nitride (AlN), a magnesium oxide (MgO), a magnesium nitride, a silicon oxide ($SiO_2$), a silicon nitride (Si-N), a silicon oxynitride (Si-O-N), $TiO_2$, and $Cr_2O_3$. Such materials function as a non-magnetic tunnel barrier, for example. The first non-magnetic layer 11c may include a non-magnetic metal, for example. By a suitable material (and thickness) of the first non-magnetic layer 11c, a magneto-resistive effect becomes effective, for example.

The first magnetic layer 11a includes at least one selected from the group consisting of FeNi and CoZr, for example. The first magnetic layer 11a includes a soft magnetic material, for example. The first magnetic layer 11a may include an alloy including at least one selected from the group consisting of Fe, Co, and Ni, for example. The first magnetic layer 11a may further include other elements selected from the group consisting of boron, silicon, and germanium, for example. The coating thickness on the first conductive layer 31 of the first magnetic layer 11a is 1 nm or more and 10 nm or less, for example.

The first non-linear element 41 is a selector, for example. The selector is a switch element, for example. The switch element includes a first terminal and a second terminal, for example. When the absolute value of the voltage applied between the first terminal and the second terminal is less than a first value, the switch element is in a first resistance state. When the absolute value of the voltage applied between the first terminal and the second terminal exceeds the first value, the switch element is in a second resistance state. The electrical resistance in the first resistance state is higher than the electrical resistance in the second resistance state. The first resistance state is in a non-conducting state, for example. The second resistance state is in a conducting state, for example. The change of the above-mentioned electrical resistance may occur when the potential of the first terminal is higher than the potential of the second terminal. The change of the above-mentioned electrical resistance may occur when the potential of the first terminal is lower than the potential of the second terminal. The electrode 41a may be the first terminal, for example. The electrode 41b may be the second terminal.

The switch element includes a first element, for example. The first element includes at least one selected from the group consisting of Te, Ge and Se, for example. The first element includes at least one selected from the group consisting of Te, Ge, Se, Nb, V and S, for example. The first element includes a chalcogen element, for example.

The switch element may include a second element in addition to the above-mentioned first element, for example. The second element includes at least one selected from the group consisting of B, Al, Ga, In, C, Si, Ge, Sn, As, N, Ti, P, and Sb.

According to the embodiments, the magnetic memory device in which the stable operation is possible can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic members, magnetic layers, non-magnetic layers, conductive layers, electrodes, insulating layers, magnetic films, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a first interconnect;
   a second interconnect;
   a first memory portion provided between the first interconnect and the second interconnect;
   a controller electrically connected with the first interconnect and the second interconnect;
   the first memory portion including
      a first magnetic member,
      a first magnetic element, and
      a first non-linear element,
   the first magnetic element being provided between the first magnetic member and the second interconnect in a first current path between the first interconnect and the second interconnect,
   the first non-linear element being provided between the first magnetic element and the second interconnect in the first current path,
   the controller being configured to supply a first shift current in the first current path in a first shift operation, and
   the controller being configured to supply a first reading current in the first current path in a first reading operation.

2. The device according to claim 1, wherein the controller includes:
   a first decoder electrically connected with the first interconnect; and
   a second decoder electrically connected with the second interconnect.

3. The device according to claim 2, wherein the controller includes:
   a shift driver connected with the second decoder; and
   a sense amplifier connected with the second decoder.

4. The device according to claim 2, wherein the controller includes:
   a shift driver connected with the first decoder; and
   a sense amplifier connected with the first decoder.

5. The device according to claim 2, wherein the controller includes:
a shift driver connected with the first decoder; and
a sense amplifier connected with the second decoder.

6. The device according to claim 2, wherein the controller includes:
a shift driver connected with the second decoder; and
a sense amplifier connected with the first decoder.

7. The device according to claim 1, wherein
the first magnetic element includes:
a first magnetic layer, and
a first non-magnetic layer provided between at least a part of the first magnetic member and the first magnetic layer.

8. The device according to claim 7, wherein
the first magnetic element further includes a first intermediate magnetic layer, and
the first intermediate magnetic layer is provided between the at least the part of the first magnetic member and the first non-magnetic layer.

9. The device according to claim 1, wherein
the first non-linear element includes at least one selected from the group consisting of Te, Se, and Ge.

10. The device according to claim 1, wherein
the first magnetic member extends along a first direction,
the first interconnect extends along a second direction crossing the first direction, and
the second interconnect extends along a third direction crossing a plane including the first direction and the second direction.

11. The device according to claim 10, further comprising a first conductive layer electrically connected with the controller and being apart from the first magnetic member,
the controller being configured to supply a first writing current to the first conductive layer in a first writing operation.

12. The device according to claim 11, wherein first information written when the first writing current flows in the first conductive layer in a first orientation is different from second information written when the first writing current flows in the first conductive layer in a second orientation reverse to the first orientation.

13. The device according to claim 1, further comprising:
a third interconnect; and
a second memory portion provided between the third interconnect and the second interconnect,
the controller being further electrically connected with the third interconnect,
the second memory portion including
a second magnetic member,
a second magnetic element, and
a second non-linear element,
the second magnetic element being provided between the second magnetic member and the second interconnect in a second current path between the third interconnect and the second interconnect,
the second linear element being provided between the second magnetic element and the second interconnect in the second current path,
the controller being configured to supply a second shift current in the second current path in a second shift operation, and
the controller being configured to supply a second reading current in the second current path in a second reading operation.

14. The device according to claim 1, wherein
the controller is configured to set the first interconnect at a first potential and to set the second interconnect at a second potential in the first shift operation,
the controller is configured to set the first interconnect at a third potential and to set the second interconnect at a fourth potential in the first reading operation,
the fourth potential is between the first potential and the second potential, and
the fourth potential is between the third potential and the second potential.

15. The device according to claim 1, wherein
the controller is configured to set the first interconnect at a first potential and to set the second interconnect at a second potential in the first shift operation,
the controller is configured to set the first interconnect at a third potential and to set the second interconnect at a fourth potential in the first reading operation,
the third potential is between the first potential and the second potential, and
the third potential is between the first potential and the fourth potential.

* * * * *